United States Patent
Murphree et al.

(10) Patent No.: US 9,634,234 B2
(45) Date of Patent: *Apr. 25, 2017

(54) DOWNHOLE ENERGY HARVESTING METHOD AND DEVICE

(71) Applicant: Oscilla Power Inc., Salt Lake City, UT (US)

(72) Inventors: Zachary Murphree, Dallas, TX (US); Balakrishnan Nair, Sandy, UT (US)

(73) Assignee: Oscilla Power, Inc., Salt Lake City, UT (US)

( * ) Notice: Subject to any disclaimer, the term of this patent is extended or adjusted under 35 U.S.C. 154(b) by 376 days.

This patent is subject to a terminal disclaimer.

(21) Appl. No.: 14/133,445

(22) Filed: Dec. 18, 2013

(65) Prior Publication Data

US 2014/0167422 A1    Jun. 19, 2014

Related U.S. Application Data

(63) Continuation-in-part of application No. 13/936,074, filed on Jul. 5, 2013.

(60) Provisional application No. 61/738,757, filed on Dec. 18, 2012.

(51) Int. Cl.

| | | |
|---|---|---|
| *H01L 41/12* | (2006.01) | |
| *H02K 7/18* | (2006.01) | |
| *H02N 2/18* | (2006.01) | |
| *E21B 41/00* | (2006.01) | |

(52) U.S. Cl.
CPC ........ *H01L 41/125* (2013.01); *E21B 41/0085* (2013.01); *H02K 7/1892* (2013.01); *H02N 2/18* (2013.01)

(58) Field of Classification Search
CPC ............. H01L 41/00; H02N 2/00; H02N 2/18
USPC ............................................................ 310/26
See application file for complete search history.

(56) References Cited

U.S. PATENT DOCUMENTS

| | | | | |
|---|---|---|---|---|
| 5,982,054 | A  * | 11/1999 | Rathore | H01L 41/12 310/26 |
| 8,890,376 | B2 * | 11/2014 | Nair | H01L 41/125 310/26 |
| 2012/0228875 | A1 | 9/2012 | Hardin, Jr. et al. | |
| 2012/0228877 | A1* | 9/2012 | Samuel | F03B 13/00 290/54 |
| 2013/0099500 | A1* | 4/2013 | Heisig | H02K 7/18 290/52 |

OTHER PUBLICATIONS

Becamel "International Preliminary Report on Patentability" for PCT Application No. PCT/US2013/076276, mailed Jun. 23, 2015, 5 pages.

\* cited by examiner

*Primary Examiner* — Hanh Nguyen
(74) *Attorney, Agent, or Firm* — Kunzler Law Group

(57) ABSTRACT

A device generates electrical energy from mechanical motion in a downhole environment. The device includes a magnetostrictive element and an electrically conductive coil. The magnetostrictive element has a first end and a second end. The first and second ends are coupled between a rotor and a bearing. The magnetostrictive element is configured to experience axial strain in response to radial movement of at least one of the rotor or the bearing with reference to the other. The electrically conductive coil is disposed in proximity to the magnetostrictive element. The coil is configured to generate an electrical current in response to a change in flux density of the magnetostrictive element.

13 Claims, 10 Drawing Sheets

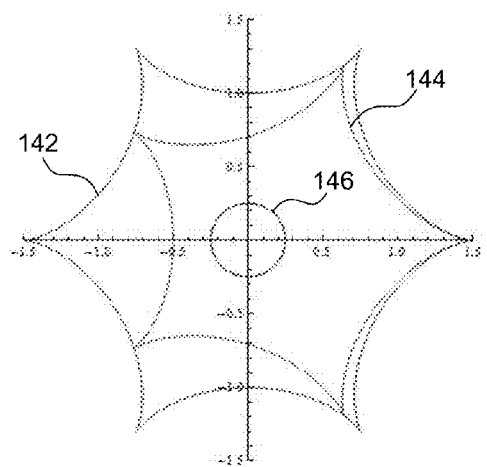
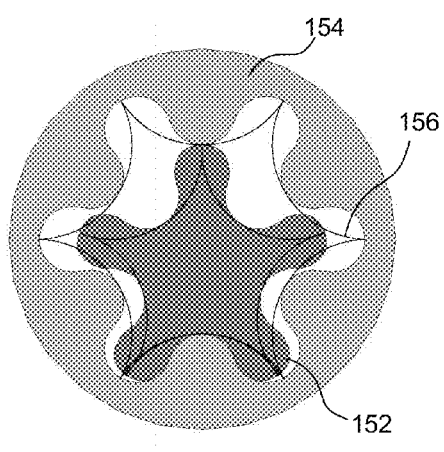
FIG. 5          FIG. 6
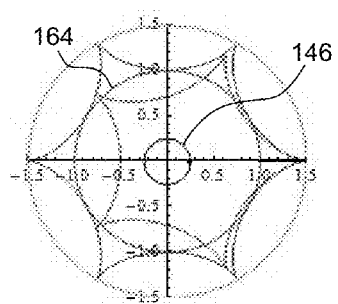 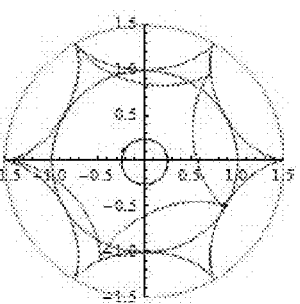 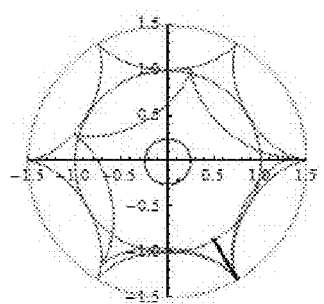
FIG. 7A    FIG. 7B    FIG. 7C

DOWNHOLE ENERGY HARVESTING METHOD AND DEVICE

CROSS-REFERENCE TO RELATED APPLICATIONS

This application is a continuation-in-part of U.S. patent application Ser. No. 13/936,074, filed on Jul. 5, 2013. This application also claims the benefit of priority of U.S. Provisional Application No. 61/738,757, filed on Dec. 18, 2012. Each of these applications is incorporated by reference herein.

BACKGROUND

Conventional magnetostrictive devices for downhole applications attempt to cause a bending through tip deflection that is imposed on a magnetostrictive rod or beam.

SUMMARY

Embodiments of an apparatus are described. In one embodiment, the apparatus is a device to generate electrical energy from mechanical motion in a downhole environment. An embodiment of the device includes a magnetostrictive element and an electrically conductive coil. The magnetostrictive element has a first end and a second end. The first and second ends are coupled between two connectors. The magnetostrictive element is configured to experience axial strain in response to radial movement of at least one of the connectors relative to the other connector. The electrically conductive coil is disposed in proximity to the magnetostrictive element. The coil is configured to generate an electrical current in response to a change in flux density of the magnetostrictive element. Other embodiments of the apparatus are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

FIG. 5 depicts one embodiment of a hypocycloid with k=6 representing cavities of a stator, with an inscribed hypocycloid of k=5 representing lobes of a rotor.

FIG. 6 depicts one embodiment of a rotor shown inside a stator, along with the hypocycloid path that the tips of each lobe of the rotor follow.

FIGS. 7A-C depict one embodiment of the motion of the rotor inside the stator.

Throughout the description, similar reference numbers may be used to identify similar elements.

DETAILED DESCRIPTION

Figure 1:
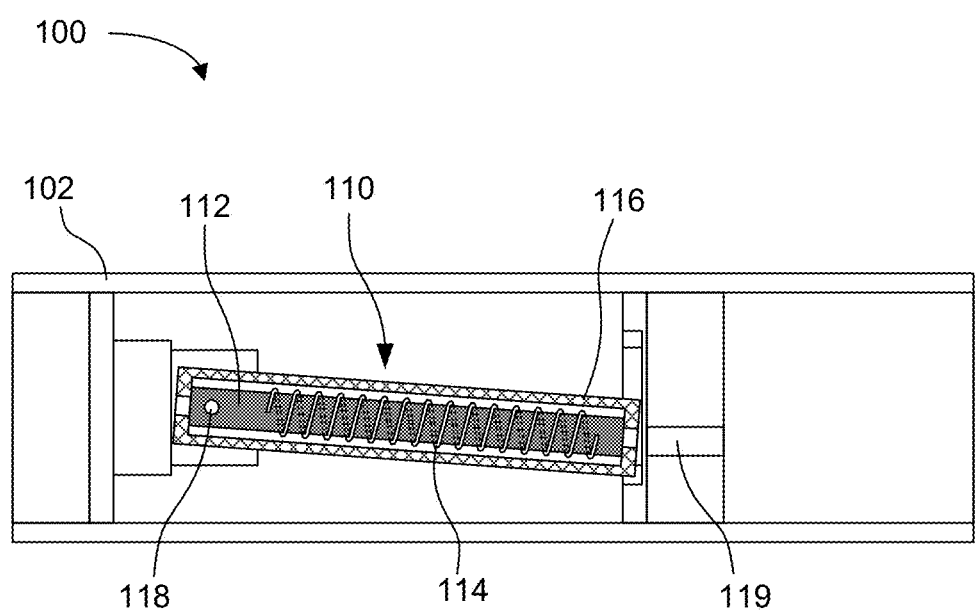
FIG. 1 depicts a cutaway view of a schematic diagram of one embodiment of a downhole energy harvester system with an axially-loaded magnetostrictive energy harvester that may be driven by a downhole tool.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Although many embodiments are described herein, at least some embodiments described herein generate electrical power through strain changes in one or more magnetostrictive elements caused by the eccentric motion of one end of a device relative to the other. For example, such eccentric motion occurs in mud motor assemblies that drive drill bits in downhole drilling operations. The rotor of the mud motor moves in an eccentric fashion inside a stator, as will be described below in greater detail.

In one embodiment, a device uses the radial motion of the eccentric center-point of the rotor of a mud motor to displace the tip of a magnetostrictive device that is hinged at both ends. One of these hinged ends is connected to the center of the rotor, and the other is connected to a rigid point above the mud motor. For example, the other end may be connected to a shaft that is mechanically coupled to a drill bit. This allows the device to operate in an axial-loading configuration rather than a flexing or bending configuration. Assuming the force is sufficiently high, the displacement will cause the magnetostrictive rod to elongate to a length determined by the Pythagorean Theorem, $A^2+B^2=C^2$, where A is the initial length of the rod, B is the imposed displacement of the hinged tip attached to the rotor of the mud motor, and C is the stretched length of the rod at said displacement.

Figure 15:
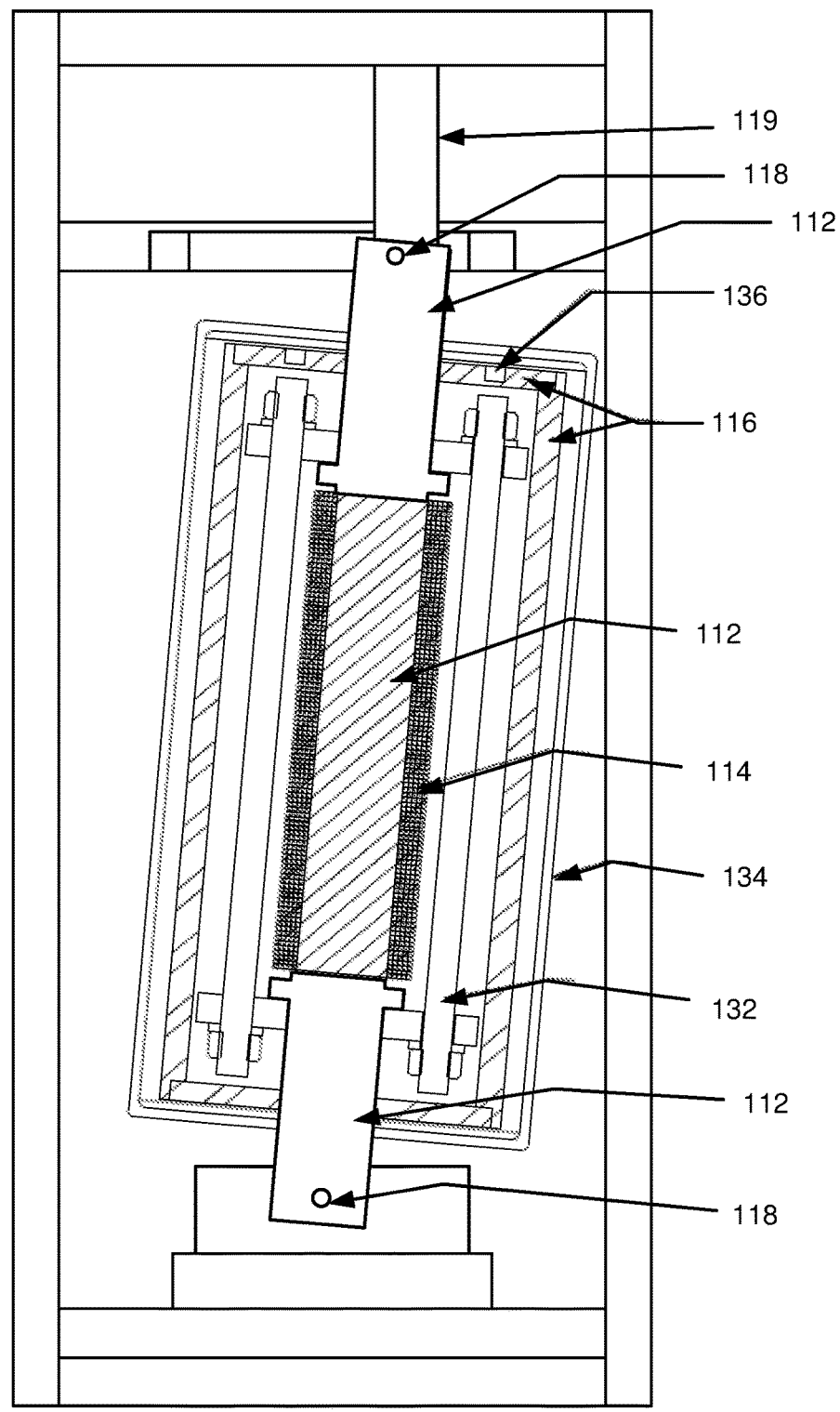
FIG. 15 depicts a cutaway view of a schematic diagram of one embodiment of a downhole energy harvester system with an axially-loaded magnetostrictive energy harvester in a first position.
Figure 16:
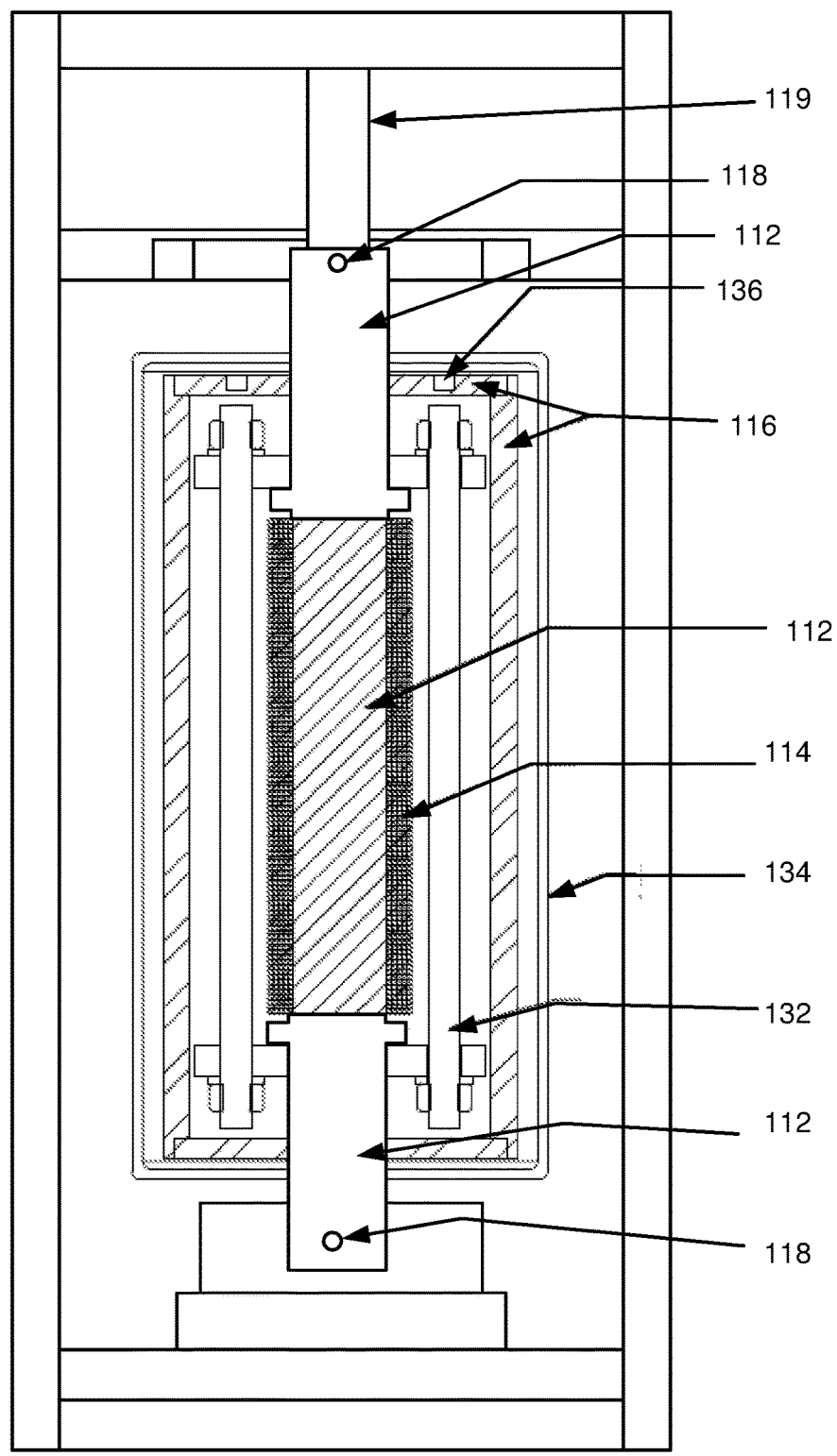
FIG. 16 depicts a cutaway view of a schematic diagram of one embodiment of a downhole energy harvester system with an axially-loaded magnetostrictive energy harvester in a second position.

FIG. 1 depicts a cutaway view of a schematic diagram of one embodiment of a downhole energy harvester system 100 with an axially-loaded magnetostrictive energy harvester 110 that may be connected to and/or driven by a downhole tool such as a mud motor. An embodiment of the device may be disposed within the annulus of a drill string 102, in which case one end is connected to a fixed, hinged connector 118 (or other flexible connector) at the mud motor, and the other end is connected to a mobile, hinged end 119 at the rotor. The end connected to the hinged end 119 may be connected to the center of the rotor or to another offset location on the rotor. This may limit the outer diameter of the device to a dimension that still allows drilling mud to pass around the device. In some embodiments, the location of the device is selected or designed so that the device is sealed from the mud. A hinge is a type of joint that attaches two items together while allowing for limited movement. For example, the hinged end 119 may be connected to the rotor and will move in sync with the rotor (e.g., the hinge will not translate relative to the rotor, like with a ball joint) but may allow rotation of the harvester 110 relative to the rotor. In an example, the hinged connector 118 may be a fixed, hinged connector that only allows for limited movement (e.g., the hinge will not translate relative to the mud motor but will allow for rotation of the harvester 110 relative to the mud motor. In such an example, the two hinges will allow the harvester 110 to always be fixed in a straight line between the two hinges and as the distance between the two hinges fluctuates as the hinged end 119 follows, for example, the hypocycloid path set forth by the rotor, an axial stress will occur on the harvester 110. Such stress occurs because of the axial displacement between the hinged end 119 and the hinged connector 118. FIGS. 15 and 16 depict a first and second position as the hinged end 119 follows, for example, the hypocycloid path set by the rotor. The axial stress on the magnetostrictive element will change as the axial displacement between the two hinged connectors 118 changes.

The depicted magnetostrictive energy harvester 110 includes a magnetostrictive rod 112, an electrically conductive coil 114 disposed around the rod 112, and a return path 116 outside of the coil 114. The magnetostrictive rod 112 may be any shape and/or size. Although some embodiments described herein have a circular cross-section, other embodiments may have other canonical or non-canonical cross-sectional shapes. The electrically conductive coil 114 may be any type of conductive material. Additionally, the coil 114 may be any length, diameter, or cross-sectional shape. The return path 116 may be made of mild steel or some other ferrous material.

Figure 2:
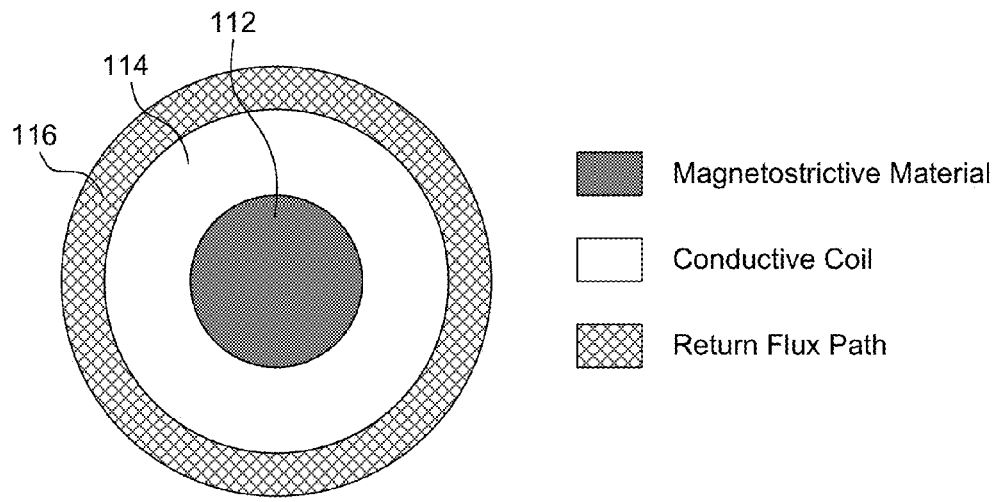
FIG. 2 depicts a cross-sectional view of the magnetostrictive energy harvester of FIG. 1.

FIG. 2 depicts a cross-sectional view of the magnetostrictive energy harvester 110 of FIG. 1. In one embodiment, the harvester 110 has a circular cross-section in the plane normal to the axis of the drill string 102. In one example, this embodiment may have the magnetostrictive rod 112 at the center of the arrangement, with the coil 114 surrounding the rod 112, and the return flux-path 116 on the outside of the coil 114.

Figure 3:
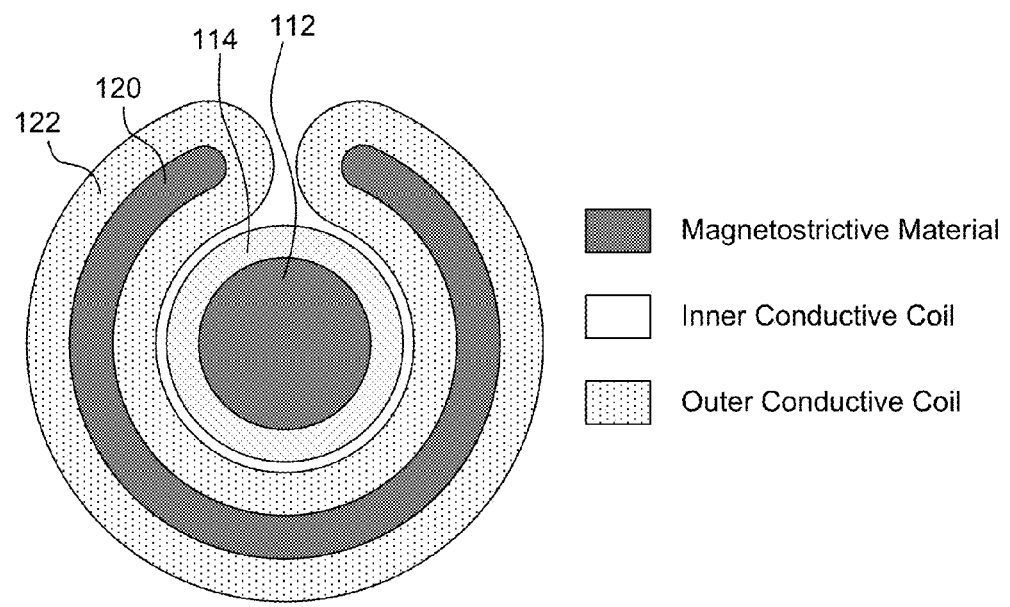
FIG. 3 depicts a cross-sectional view of another embodiment of a magnetostrictive energy harvester having a separate magnetostrictive material for the return flux path.

FIG. 3 depicts a cross-sectional view of another embodiment of a magnetostrictive energy harvester having a separate magnetostrictive material 120 for the return flux path. Also, a separate coil 122 is wrapped around the second magnetostrictive material 120. For this to be viable, in one embodiment the outer rod is split such that its cross-section resembles an annulus with an arc of material missing, i.e., it not a complete circular path. The second coil 122 is wrapped around this second magnetostrictive rod 120 in a manner that does not also include wrapping around the inner coil 114 and inner magnetostrictive rod 112. In one embodiment, the cross-section of the out rod 120 is in the shape of a "C" and the coil is wrapped around the C-shaped rod. Thus, the combined elements include a central magnetostrictive rod 112 and coil 114, and an outer C-shaped rod 120 and coil 122.

Figure 4:
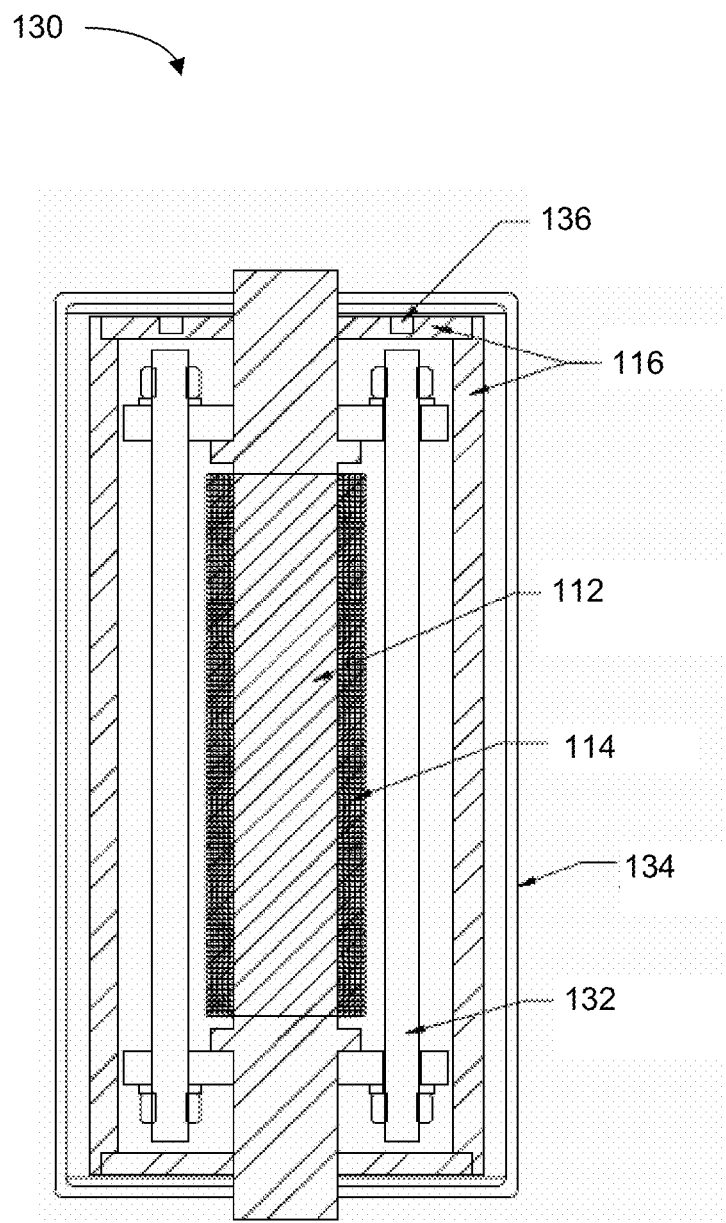
FIG. 4 depicts a cutaway view of a schematic diagram of one embodiment of a pressure vessel with a compression fixture to impose compression on a magnetostrictive energy harvester.

FIG. 4 depicts a cutaway view of a schematic diagram of one embodiment 130 of a pressure vessel 134 with a compression fixture 132 to impose compression on a magnetostrictive energy harvester. One embodiment of the pressure vessel 130 includes a compression 132 fixture that maintains the magnetostrictive elements in compression throughout the entire operating motion. Another embodiment disposes the harvester such that its lowest state of compression would occur at one extreme of the tip excursion. This configuration may obviate the need for a compression fixture within the device, and would instead use the structure surrounding the device (e.g., the drill string and downhole tool) to rigidly locate the device and maintain compression.

In some embodiments, the downhole tool may be a mud-motor that imposes an eccentric motion on the tip of the power generation device, causing an axial deflection of the magnetostrictive rod.

In at least one embodiment, the hinge point at the upper end of the device (farthest from the mud motor) has an important effect on the operation of the device. If the hinge point is located directly above the center of the circle of eccentricity of the rotor (which would coincide with the center of the BHA or drill-pipe, in most cases), then the frequency of the loading of the rod becomes twice the frequency of the eccentric rotation of the rotor. As an example, a mud motor with 4 lobes that has a motor rotary speed of 120 cycles per minute (2 Hz) would rotate around its circle of eccentricity at a frequency of 8 Hz. The center-mounted upper hinge configuration would go through two complete loading cycles for each of these rotations, for a total loading frequency of 16 Hz. Some embodiments of this design might require that the motion of the tip attached to the mud motor be constrained to a linear path, which could affect its overall efficiency and cost/ease of implementation.

Alternatively, the upper hinge point can be located off-center, which provides for a larger total deflection at the cost of operating at half the frequency of the center-mounted hinge point. This configuration has the potential benefit of not requiring the tip to be constrained to a linear translational motion, and can instead operate with the tip moving in the circular path that follows the circle of eccentricity of the rotor.

Initial modeling of this device suggests that embodiments may easily reach a power level above 10 W, assuming sufficient force is available to cause the required deflection. The calculation shown below is for a 20" long magnetostrictive rod with an imposed displacement of 0.25" at the end connected to the mud motor rotor. The extension caused by this displacement is 0.0015". With an operating frequency of 14 Hz, which would be caused by a 7 Hz rotation of the rotor about its circle of eccentricity, the power output predicted is on the order of 100 W. A relatively conservative calculation of the flux density change in the rod yields a power output of nearly 40 W.

| Inputs | | |
|---|---:|---|
| $\Delta B$ | 1 | Tesla |
| $\Delta \sigma$ | 25 | Mpa |
| Wire Gauge | 14 | |
| Rod Length | 20 | inches |
| | 0.508 | m |
| Rod Diameter | 1.125 | inches |
| Imposed Deflection | 0.25 | inches |
| | 0.00635 | m |
| Young's Modulus | 154 | GPa |
| Frequency | 14 | Hz |
| Wire layers | 8 | |
| Load Multiplier | 1 | |
| Calculated Parameters | | |
| Single Mag Rod Area | 0.0006 | m2 |
| Extension | 3.9686E-05 | m |
| Strain | 7.8E-05 | |
| Wire Dia | 1.6 | mm |
| Av. $\Delta B/\Delta \sigma$ | 0.04 | T/MPa |
| Turns on alloy | 2512 | turns |
| Coil Av. Dia - mag rod | 1.6 | inches |
| Coil Length | 327 | m |
| Coil Resistance | 4 | Ohms |
| Load Resistor | 4 | ohms |
| Load change | 1733 | lbs |
| | 8 | kN |
| Stress Change | 12.0 | MPa |
| Precompression | 12 | MPa |
| Power Calcs | | |
| Average Based Calcs | | |
| Av. Voltage | 10.9 | V |
| Av. Current | 1.4 | A |
| Av. Power | 7.8 | W |
| Calcs using dB curve | | |
| Calc. Power | 105.796 | W |
| Calcs with linear dB | | |
| Calc. Power | 38.2 | W |

In some embodiments, at least one permanent magnet is located within or disposed relative to the return path 116.

Some embodiments of the proposed device generate electrical power through strain changes in one or more magnetostrictive elements 112 caused by the eccentric motion of one end (see 119) of the device relative to the other end (see 118). One common application where such motion occurs and where power generation is needed is in the mud motor assembly that drives the drill bit in downhole drilling operations. The rotor of the mud motor moves in an eccentric fashion inside the stator. The rotor has at least one less lobe than the stator has cavities, and the rotor traces out a path that can be described as a hypocycloid. This geometry occurs when a fixed point on the perimeter of a circle is traced while the circle rolls within a larger circle. The number of cusps on a hypocycloid is determined by the ratio of radii of these two circles (k). When the ratio is a whole number, the hypocycloid will be a closed shape. In a mud motor, the path of the rotor can be described by a hypocycloid with a ratio k, and the shape of the rotor will then be that of the hypocycloid with a ratio of k−1.

FIG. 5 depicts one embodiment of a hypocycloid 142 with k=6 representing cavities of a stator, with an inscribed hypocycloid 144 of k=5 representing lobes of a rotor. The central circle 146 is the circle of eccentricity, which is the locus of points of the center of the rotor as it moves eccentrically within the stator.

Practically, the rotor and stator do not necessarily have the sharp cusps of the hypocycloids 142 and 144. Instead, the rotor and/or stator may have rounded edges. FIG. 6 depicts one embodiment of a rotor 152 shown inside a stator 154, along with the hypocycloid path 156 that the tips of each lobe of the rotor follow. In this figure, the hypocycloid 156 that the rotor follows as it rotates is included for clarity. In the remainder of the descriptions, the hypocycloids will be used as their parametric equations are more easily manipulated than that of the actual rotor. In addition, while the specifics of the rotor/stator geometry are often different between various manufacturers, the underlying principle, which is represented clearly by the hypocycloids, is unchanging.

FIGS. 7A-C depict one embodiment of the motion of the rotor 152 inside the stator 154. As the rotor 152 moves inside the stator 154, it is rotating in a clockwise direction while also precessing counterclockwise about the circle of eccentricity. In FIG. 7A, the cusp of the rotor hypocycloid that is initially at (1.5, 0) moves into the fourth quadrant in FIG. 7B, and eventually mates with the fourth quadrant cusp of larger stator hypocycloid in FIG. 7C In FIGS. 7A-C, the outer circle 162 is termed the apocentric circle to represent the farthest excursion of the rotor cusp from the axis of the stator 154, which is coincident with the origin. The intermediate circle 164 is termed the pericentric circle to represent the closest that the rotor cusp gets to the stator axis. This distance is further illustrated by thick black line that is drawn between the pericentric circle and the rotor cusp in each frame.

Referring to the illustrations of FIGS. 7A-C, the device may be disposed at the upper end of the mud motor (the end farthest from the drill bit). The rotor end of the device would be pinned on or very near one of the lobes of the rotor, and the other end would be pinned to a bearing assembly, located above the mud motor, that is allowed to rotate at the same speed as the rotor, albeit in a non-eccentric fashion, about the same axis as the mud motor.

In one embodiment, the pinning location on the bearing assembly would be located some distance from the axis of rotation. A device connected between the rotor and bearing assembly would experience a change in length caused by the rotor end of the device moving closer to and farther from the axis of the borehole as the assembly rotates because the bearing assembly and the rotor are synchronously rotating around the axis of the borehole. The distance between the pericenter and apocenter, which is equivalent to the diameter of the eccentric circle, and the particular geometry of the assembly would determine the axial strain applied to the device. As this strain is applied to the magnetostrictive component, corresponding changes in the magnetic properties of the material result. This change in magnetic properties, when coupled with an external flux path and a bias magnetic field, will produce changes in the magnetic flux through the magnetostrictive, which can then be converted into electrical power through conventional induction with a coil surrounding some portion of the flux path.

Figure 8A:
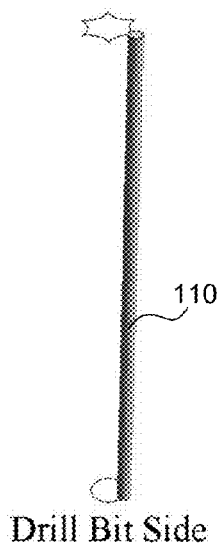
FIGS. 8A-C depict one embodiment of locations of the harvester for corresponding locations of the rotor shown in FIGS. 7A-C.
Figure 8B:
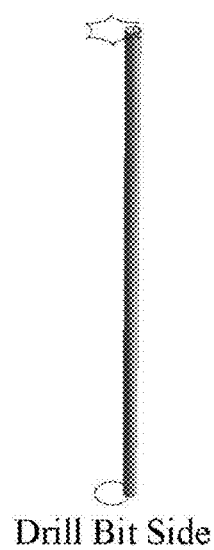
Figure 8C:
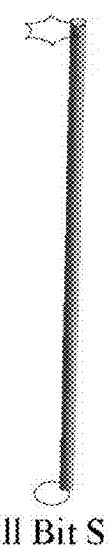

FIGS. 8A-C depict one embodiment of locations of the harvester for corresponding locations of the rotor shown in FIGS. 7A-C. In FIG. 8A, the harvester 110 is at its longest (apocenter). If this position is taken to be the location of minimum axial strain in the device, then FIG. 8B shows the harvester 110 at pericenter, which corresponds to the maximum strain position. FIG. 8C shows the device at the apocenter, again, although at a different point as the top end of the device rotates counter-clockwise at the rotor side of the assembly.

Figure 9:
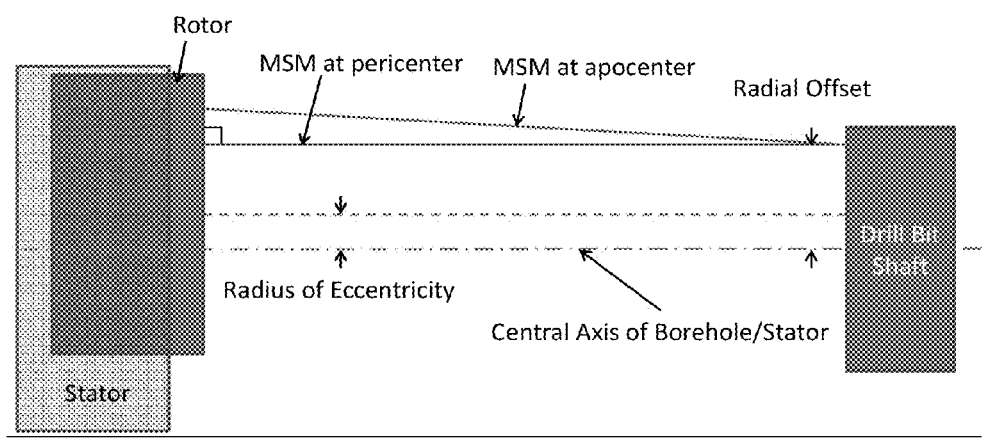
FIG. 9 depicts one embodiment of a harvester disposed between the rotor of the mud motor and the drill bit shaft.

FIG. 9 depicts one embodiment of a harvester disposed between the rotor of the mud motor and the drill bit shaft. In an embodiment of a mud motor, the rotor 152 is connected to the drill bit with a flex shaft (not shown). This shaft accommodates the eccentricity of the rotor 152 while also transferring the torque produced by the mud motor to the drill bit. The rotor end of the flex shaft is rigidly connected to and concentric with the rotor 152, and the drill bit end is located in the center of the bore axis (concentric with the stator 154) by a set of bearings. In one embodiment of the current device, the rotor end of the device is pinned on or very near one of the lobes of the rotor 152, and the other end is pinned at or near the flex shaft, or at some fixture that is either coupled to or rotates with the flex shaft.

Here the radial offset is essentially the flex shaft. Since the flex shaft and the rotor 152 are synchronously rotating around the axis of the borehole, a harvester connected between the rotor 152 and the drill bit shaft, as described above, would experience a change in length caused by the rotor end of the device moving closer to and farther from the axis of the borehole as the assembly rotates. The distance between the pericenter and apocenter, which is equivalent to the diameter of the eccentric circle, and the particular geometry of the assembly would determine the axial strain applied to the harvester.

In one embodiment, a magnetostrictive element is disposed between the rotor 152 and the drill bit shaft. Strain is applied to the magnetostrictive element 112 as one end of the magnetostrictive element 112 moves closer to and farther from the axis of the borehole as the assembly rotates. This strain results in corresponding changes in the magnetic properties of the magnetostrictive material 112. These changes in magnetic properties, when coupled with an external flux path 116 and a bias magnetic field (e.g., from one or more permanent magnets 136), will produce changes in the magnetic flux through the magnetostrictive element 112, which can then be converted into electrical power through induction with the coil 114 surrounding some portion of the flux path.

Figure 10:
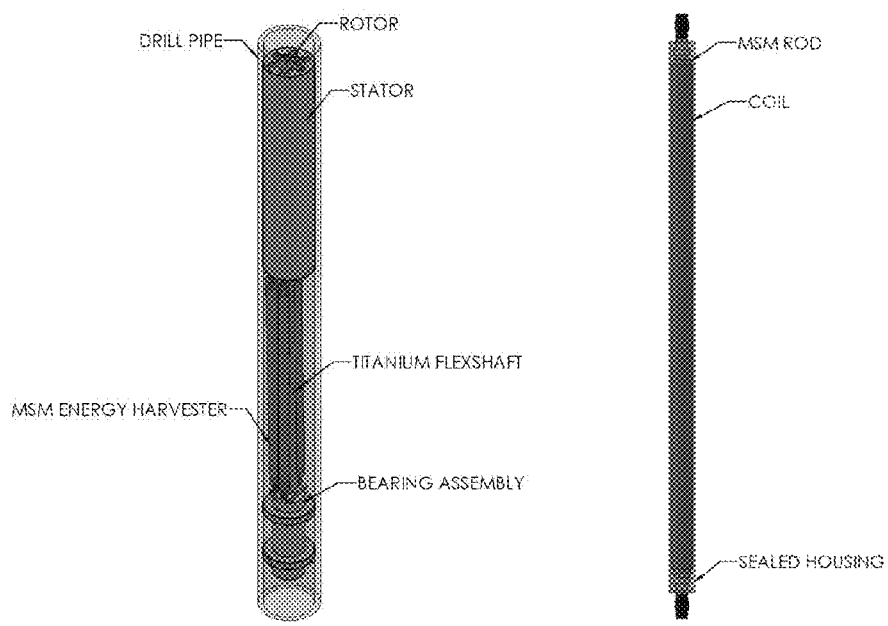
FIG. 10 depicts an embodiment with multiple individual PTOs deployed around the flex shaft.

FIG. 10 depicts an embodiment with multiple individual harvesters 110 deployed around the flex shaft. This allows multiple magnetostrictive rod/flux path assemblies to be disposed between the rotor 152 and the drill bit shaft. Also shown is one of the individual magnetostrictive power take-off (PTO) units.

Figure 11:
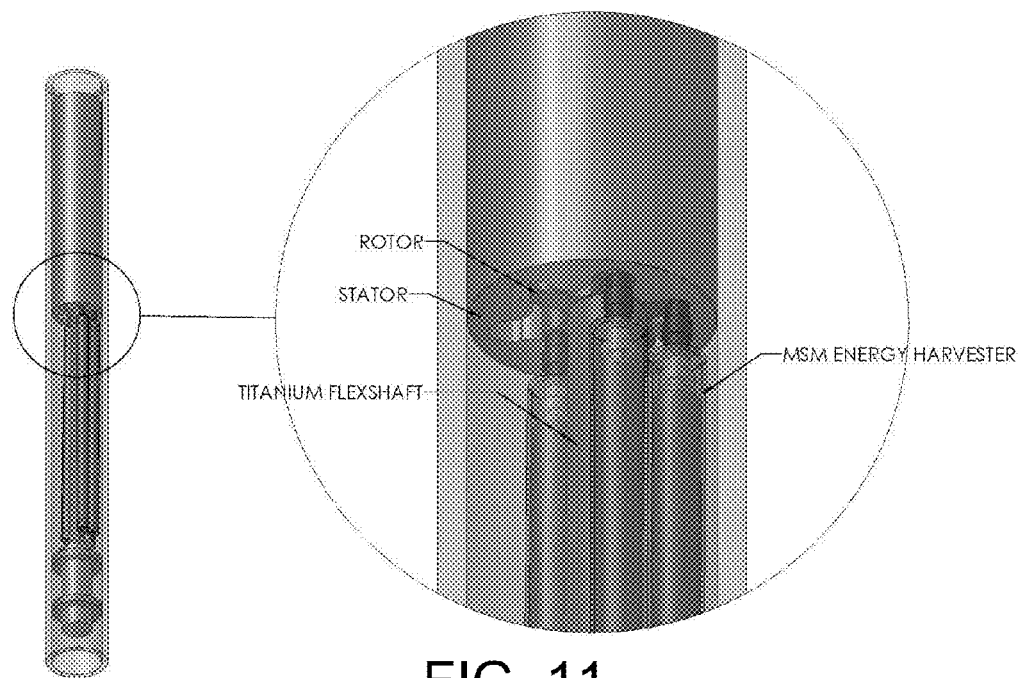
FIG. 11 depicts a close-up of a one embodiment of an interface configuration between the rotor and the harvester.

FIG. 11 depicts a close-up of a one embodiment of an interface configuration between the rotor and the harvester.

In some embodiments of the device, one or more magnetostrictive rods or elements may be able to generate over 1 Watt of power. In further embodiments, one or more rods may be able to generate more than 10 Watts of power.

There are a number of ways to increase the amount of stress applied to the magnetostrictive for a given mud motor geometry. The first way is to decrease the length between the two pinning points (e.g., the rotor and the bearing). Because the compression/extension of the device is determined by the eccentricity of the rotor motion, a shorter magnetostrictive will have higher strain, which equates to a higher stress in the element (Table 1). The second way to increase the stress in the rod is to alter the pinning locations of each end of the device. The main objective in doing this is to increase the angle of the device from horizontal, which results in a larger component of the deflection caused by the eccentric motion to be along the axis of the magnetostrictive element. In an extreme example, the magnetostrictive would be normal to the axis of the borehole, which would result in all of the deflection caused by the eccentricity to be along the axis of the magnetostrictive, thereby resulting in an extension/compression of the magnetostrictive equal to the eccentric diameter. In another exemplary configuration, the pinned end at the rotor may be located as far away from the rotor axis as possible, and the pinned end at the bearing assembly is as close to the bearing's axis of rotation.

TABLE 1

Change in stress for various device initial lengths and an eccentric radius of 0.25"

| | Initial Length (in) | | | | | | |
|---|---|---|---|---|---|---|---|
| | 12 | 18 | 24 | 30 | 36 | 42 | 48 |
| Minimum Length (in) | 11.9896 | 17.9931 | 23.9948 | 29.9958 | 35.9965 | 41.9970 | 47.9974 |
| Strain | 868.4 | 385.9 | 217.0 | 138.9 | 96.5 | 70.9 | 54.3 |
| Max Stress (MPa) | 133.7 | 59.4 | 33.4 | 21.4 | 14.9 | 10.9 | 8.4 |

Figure 12:
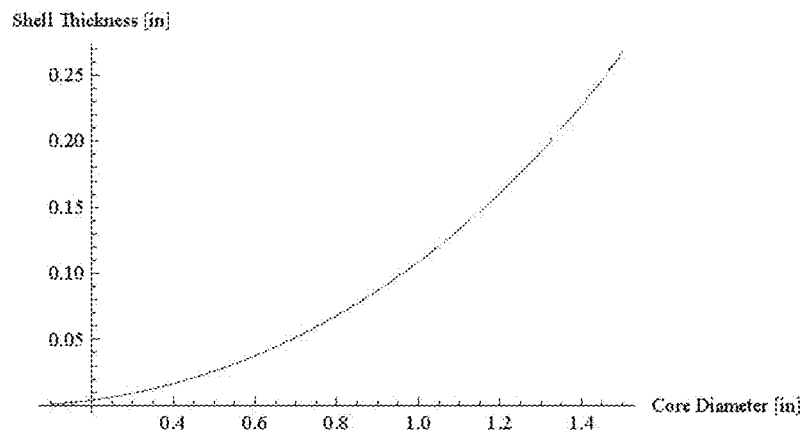
FIG. 12 depicts a graph illustrating shell thickness as a function of core diameter.

Another method to increase the power output of the device is to increase the diameter of the magnetostrictive core. In one embodiment, the allotted volume contains the magnetostrictive core, a coil of electrically conductive material, and a return flux path, as described above. In one embodiment of the device, all of these components are concentric, with the magnetostrictive as the innermost cylinder, surrounded by a coil of wire, and all enclosed in an annular return flux path. This configuration also may have magnetically permeable flux path elements on the top and bottom to magnetically connect the magnetostrictive to the outer flux path. The return flux path is sized appropriately in order to prevent saturation of this component. For the saturation magnetizations of the magnetostrictive and flux path material equal to 1.4 and 1.7 T, respectively. One example of a graph illustrating this optimization is seen in FIG. 12.

Figure 13:
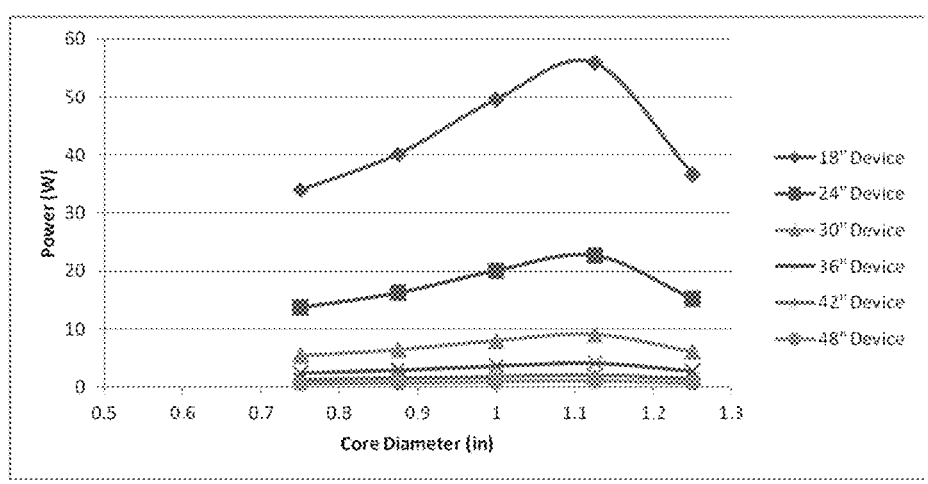
FIG. 13 depicts a graph illustrating power output as a function of core diameter for different device lengths.

An optimization of the core diameter for power production indicates, in one example, that the largest possible core may be used while still allowing for a coil with 2-4 layers of wire, independent of wire gauge. This assumes that inductive effects can be fully compensated, which will be a function of the frequency at which the device is expected to operate. An example of this optimization is shown in FIG. 13. For a given device length, the power output increases exponentially with the diameter of the core, up to a point where the coil becomes too small. The power numbers shown here are representative. This figure also shows how the power output increases with the device length.

One issue that may be considered as the core diameter is increased is that the amount of force required of the mud motor in order to apply the given deflection increases with the square of the diameter of the core. This may have design implications for a given mud motor or bearing system design.

Figure 14:
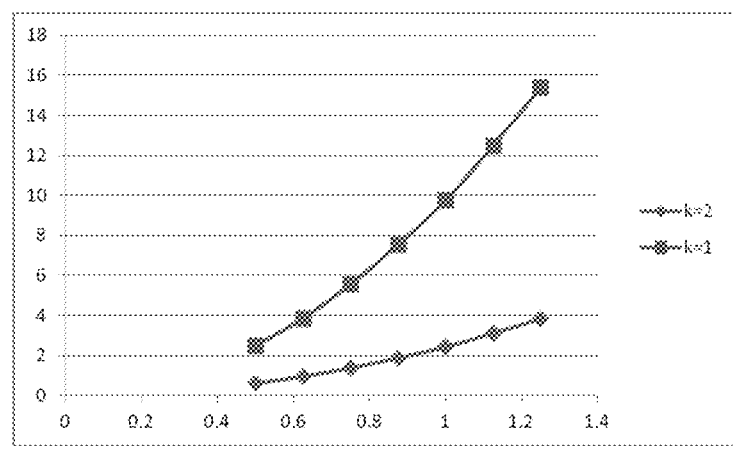
FIG. 14 depicts a graph illustrating a safety factor for buckling of a device.

Buckling is not expected to be an issue as long as the core diameter is above a certain threshold. For example, for an eccentric radius of 0.25", FIG. 14 shows the buckling safety factor as a function of core diameter. The buckling safety factor is the critical buckling stress divided by the actual applied stress. Two different k values are shown. The first, k=2, is a worst case scenario in Euler buckling theory. The other, k=1, is for a beam with pinned ends, such as the mud motor described above. FIG. 14 illustrates that even for the worst case scenario, a device as described herein may have an acceptable safety factor for core diameters greater than 0.75".

Other embodiments may incorporate one or more other aspects from related descriptions, including the subject matter described and shown in U.S. application Ser. No. 13/016,828, filed on Jan. 28, 2011, and entitled "Wave Energy Harvester with Improved Performance," U.S. application Ser. No. 13/336,843, filed on Dec. 23, 2011, and entitled "Mechanical Energy Harvester," U.S. application Ser. No. 13/016,895, filed on Jan. 28, 2011, and entitled "Apparatus for Harvesting Electrical Power from Mechanical Energy," U.S. application Ser. No. 13/541,250 filed on Jul. 3, 2012, and entitled "Apparatus for Harvesting Electrical Power from Mechanical Energy," U.S. Provisional Application No. 61/668,280, filed on Jul. 5, 2012, and entitled "Power Generation MWD/LWD Tools and Telemetry," and U.S. Provisional Application No. 61/674,982, filed on Jul. 24, 2012, and entitled "Method and Device for Downhole Power Generation," each of which is incorporated herein in its entirety.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A device for generating electrical energy from mechanical motion, the device comprising:
   a magnetostrictive element comprising a first hinged end coupled to a rotor at a position adjacent to a perimeter of the rotor, and a second end coupled to a bearing at a position representative of an axis of rotation of the bearing;
   wherein the magnetostrictive element is configured to experience axial strain in response to radial movement of at least one of the rotor or the bearing relative to the other; and
   an electrically conductive coil disposed in proximity to the magnetostrictive element, wherein the coil is configured to generate an electrical current in response to a change in flux density of the magnetostrictive element.

2. The device of claim 1, wherein the magnetostrictive element is configured to experience axial loading in response to the relative movement between the two ends.

3. The device in claim 1, wherein the magnetostrictive element and the coil are at least partially disposed within an annulus of a drill string.

4. The device in claim 3, wherein the magnetostrictive element and the coil are at least partially disposed out of a fluid flow path.

5. The device in claim 1, further comprising:
   a plurality of magnetostrictive elements; and
   a plurality of electrical coils.

6. The device in claim 1, further comprising a compression fixture coupled to the magnetostrictive element to maintain the magnetostrictive element in compression throughout a range of relative motion of the ends.

7. The device in claim 1, wherein the magnetostrictive element is further configured to experience multiple stress cycles for each movement cycle of the connectors.

8. A device for generating electrical energy from mechanical motion, the device comprising:
   a magnetostrictive element comprising a first hinged end coupled to a rotor at a position adjacent to a perimeter of the rotor, and a second end coupled to a bearing at a position representative of an axis of rotation of the bearing;
   wherein the magnetostrictive element is in proximity to a mud motor and is configured to experience axial strain in response to radial movement of at least one of the rotor or the bearing relative to the other; and
   an electrically conductive coil disposed in proximity to the magnetostrictive element, to generate an electrical current in response to a change in flux density of the magnetostrictive element.

9. The device of claim 8, wherein the magnetostrictive element is configured to experience axial loading in response to the relative movement between the two ends.

10. The device in claim 8, wherein the magnetostrictive element and the coil are at least partially disposed within an annulus of a drill string.

11. The device in claim 10, wherein the magnetostrictive element and the coil are at least partially disposed out with of a fluid flow path.

12. The device in claim 8, further comprising:
   a plurality of magnetostrictive elements; and
   a plurality of electrical coils.

13. The device in claim 8, wherein one of the ends is coupled to a rotor, and a corresponding end of the magnetostrictive element is further configured to experience eccentric movement in response to rotary movement of the end coupled to the rotor.

* * * * *